United States Patent [19]

Meline

[11] Patent Number: 4,901,764
[45] Date of Patent: Feb. 20, 1990

[54] DYNAMIC CONFINEMENT AND CONTACTLESS DOCKING

[75] Inventor: Francois Meline, Paris, France

[73] Assignee: Societe Generale Pour les Techniques Nouvelles -SGN-, Saint Quentin En Yvelines Cedes, France

[21] Appl. No.: 259,302

[22] Filed: Oct. 18, 1988

[30] Foreign Application Priority Data

Oct. 20, 1987 [FR] France ................................. 87 14469

[51] Int. Cl.$^4$ ................................................. F24F 9/00
[52] U.S. Cl. ............................... 137/803; 55/DIG. 29; 98/36
[58] Field of Search .................................. 137/13, 803; 55/DIG. 29; 98/36

[56] References Cited

U.S. PATENT DOCUMENTS 3,068,775  12/1962  Zehnder ........................ 55/DIG. 29
4,534,277   8/1985  Gillmor ................................... 98/36

Primary Examiner—Alan Cohan
Attorney, Agent, or Firm—Staas & Halsey

[57] ABSTRACT

An apparatus for isolating an enclosure from external pollution includes a tube (2) with one end opening out into the enclosure and with its opposite end (5) being open. At least one slot (6) is provided in the inside wall of said tube in the vicinity of its opening (5), the slot being disposed in a plane perpendicular to the axis of said tube and sloping towards the opening. The slot is fed with gas so as to blow a continuous sheet of gas into the tube. At least one porous plate is disposed on the inside wall of said tube between the slot (6) and the opening (5), and the plate is fed with a gas which forms a small flow of gas suitable for overcoming the pressure reduction formed by the sheet of gas leaving from said slot (6). The enclosure is maintained at a pressure which is slightly higher than its surroundings so as to create a flow of gas running along said tube (2) and deflecting the sheet or sheets of gas leaving the slot (6) towards the opening (5).

8 Claims, 3 Drawing Sheets

DYNAMIC CONFINEMENT AND CONTACTLESS DOCKING

BACKGROUND OF THE INVENTION

A wafer of semiconductor material (e.g. monocrystalline silicon) is subjected to multiple physiochemical treatments prior to becoming an electronic component (transistor, integrated circuit, etc.).

These treatments are performed in closed enclosures so as to take place under strictly controlled atmospheres, and in particular in the absence of any dust.

Workpieces need to be transferred from one enclosure to another using a moving enclosure, but without breaking the confinement and without running any risk of contamination.

it is easy to place a workpiece in a controlled atmosphere by using air-tight doors (with gaskets that are clamped).

It is also easy to transfer a workpiece from a fixed enclosure to a moving enclosure after docking the moving enclosure to the fixed enclosure, locking the enclosures together, clamping air-tight gaskets between them, and then opening separating doors.

Experience shows that all sorts of mechanical solutions are good at ensuring that the workpieces remain in a controlled atmosphere, but that they are disastrous when it comes to dust pollution.

Any air-tight door presupposes a gasket which is compressed, including friction and mechanical clamping, all of which operations generate dust. Opening the doors after docking is an even more pernicious operation since when the door is opened, the outside of the door moves into the inside the enclosure.

SUMMARY OF THE INVENTION

The present invention solves the problem of the controlled atmosphere by dynamic closure and it solves the problem of dust by omitting all mechanical parts such as door gaskets, locking systems, etc.

A main characteristic of the invention is to operate in an enclosure which is at a slightly higher pressure than its surroundings and which includes an opening at the end of a tubular element which opens out into the enclosure.

The slightly higher than surrounding pressure gives rise to an outward flow of gas through the opening; since the speed of the flow needs to be limited, it is advisable to operate with a pressure difference of less than 10 Pascals (equivalent to one millimeter of water column).

One (or more) slot(s) in the tubular element in the vicinity of the opening serve to allow a gas to be blown therein so as to form a continuous sheet which separates the enclosure from the outside.

Another important characteristic of the invention is to blow a small flow of gas (small relative to the flow blown via the slot) via one (or more) sintered plate(s) situated between the slot and the opening of the tubular portion.

BRIEF DESCRIPTION OF THE DRAWINGS

Embodiments of the invention are described by way of example with reference to the accompanying drawings, in which.

DETAILED DESCRIPTION OF THE PREFERRED EMBODIMENTS

Figure 2:
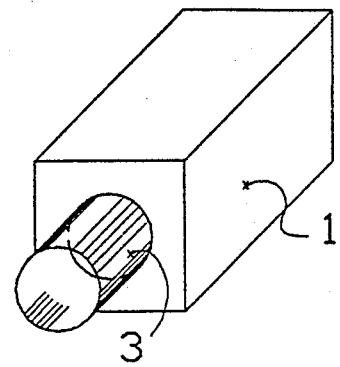
FIG. 2 is a perspective view of an enclosure having a tubular extension of circular section.

An enclosure 1 is at a higher pressure than its surroundings and is provided with a tubular extension of rectangular section (reference 2) or of circular section (reference 3, FIG. 2).

This extension is referred to below as a "tube".

Figure 1:
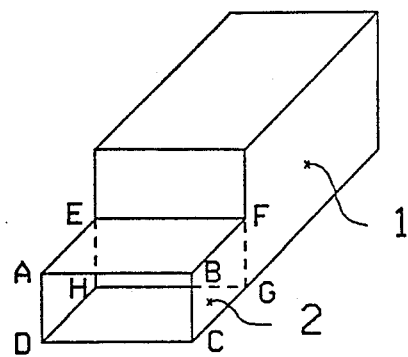
FIG. 1 is a perspective view of an enclosure having a tubular extension of rectangular section.

The front face of the tube is open: in FIG. 1, its face ABCD is an opening that does not have a door.

For the purposes of simplification, the organization of a rectangular tube is described in detail, and thereafter points which are specific to the internal organization of a circular tube are mentioned briefly.

Figure 3:
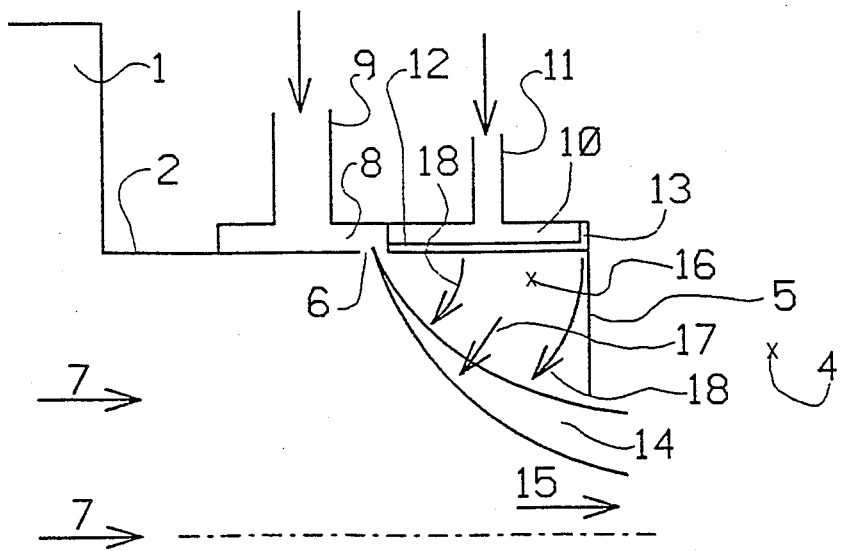
FIG. 3 is a section showing the theory behind the creation of continuous sheets of air flow.

The principle of the invention consists in replacing a solid door by one or more continuous sheets of gas, as shown in FIG. 3.

The enclosure 1 is at a higher pressure than that of the outside atmosphere 4, and as a result there is a regular gas flow 7 into the tube 2.

Slots 6 are provided in each of the two opposite faces of the tube 2 close to its opening 5 and extending parallel to side AB (FIG. 1) with each slot occupying the entire inside width of the tube. Each slot opens out to the inside of the tube 2.

In the case shown in FIG. 1, there is thus one slot in the face ABFE and another slot in the face DCGH, and both of these two slots are parallel to AB.

The above-defined faces are selected for the slots because it is more advantageous to place the slots in the bigger faces.

Whether these faces are vertical or horizontal is of no importance, and this is underlined by the fact that the tube may be circular in section.

In each of the corresponding faces, the slot 6 is fed with gas from a chamber 8 provided with a gas inlet 9. A second chamber 10 (provided with a gas inlet 11) is provided in each of the faces having a slot, and is located between the slot and the end of the tube (e.g. edge AB).

The chamber 10 is "closed" to the inside of the tube 2 by a plate of porous material 12. It is also advantageous to close the chamber 10 towards the opening of the tube by a porous plate 13. It is also possible to make use of a plate which is formed so as to combine the plates 12 and 13 in a single part.

Operation is as follows: the gas flow 7 curves the sheet 14 leaving the slot 6. A portion of the flow 7 enters into the sheet 14, while the remainder exits parallel to the mid-plane along arrow 15.

The zone 16 between the sheet 14 and the inside face of the tube is at reduced pressure since the jet 14 sucks in gas from its surroundings (e.g. along arrow 17).

The reduced pressure in the zone 16 means that outside air enters into the tube 2 and this could give rise to pollution.

In order to minimize or eliminate this reduced pressure, a small flow of gas 18 is blown in through the porous plates 12 and 13. The flow rate at the inlet 11 is adjusted to eliminate the reduced pressure.

Figure 4:
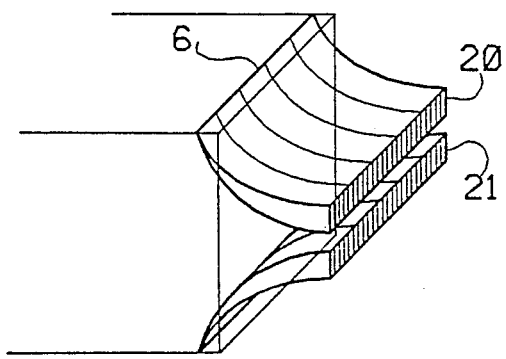
FIG. 4 is a perspective view of the continuous sheets for a rectangular tube.

FIG. 4 shows the shape of the two continuous sheets of gas flow 20 and 21 leaving the two opposite slots (such as 6).

In order to simplify the drawing, FIG. 4 shows the tube 2 in outline only.

It must not be forgotten that the entire space between the two sheets 20 and 21 is filled by the flow 15 due to the enclosure being at increased pressure, which flow enters the tube 2 along arrows 7.

The entire area of the opening has one or more gas flows going through each point thereof. There is no point in the area of the opening, not even in the vicinity of its sides, through which there is not at least one flow of gas passing out. As a result, there is no possibility of air, dust, etc., entering from the outside and travelling towards the inside of the enclosure.

Figure 5:
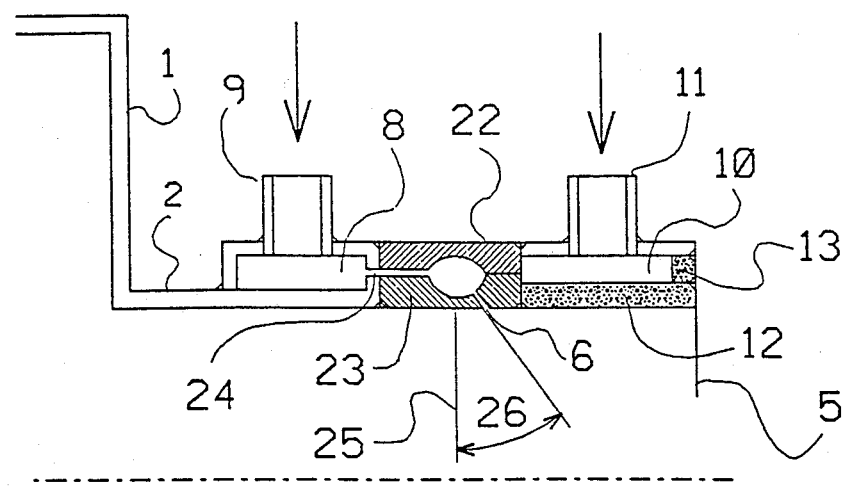
FIG. 5 is a section showing a detail of a slot.

FIG. 5 shows the detailed structure of a portion of the face of the tube 2 close to the opening 5. This figure shows the chamber 8 and the gas inlet 9 communicating with the slot 6 via a space 24 provided between parts 22 and 23.

The slot 6 is machined in the part 23 so as to slope towards the outside opening of the tube.

The angle 26 between the slot and the normal 25 to the wall is generally chosen to have a value close to 30°.

The figure also shows the chamber 10, its gas inlet 11, and the porous plates 12 and 13.

The plate 12 closes that side of the chamber 10 which is adjacent to the inside of the tube 2. The plate 13 closes that side of the chamber 10 which faces the outlet of the tube 2 (face ABCD in FIG. 1). It may be advantageous for the plate 13 to project slightly outwardly from the tube. In this way, the flow of air leaving through the plate 13 has the effect of keeping the outside face of the plate 13 clean.

Depending on the nature of the porous material used, the parts 12 and 13 may either be two separate parts or else they may be two portions of a single part.

Figure 6:
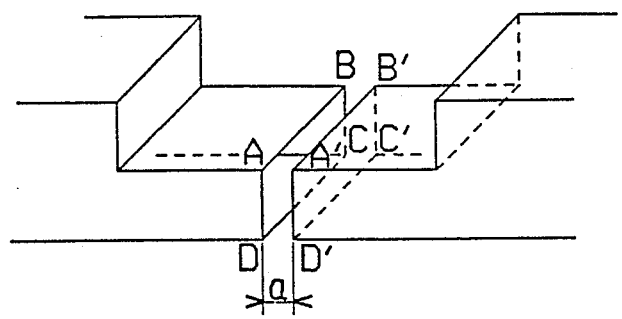
FIG. 6 is a perspective view of contactless docking.

When two enclosures are brought close to each other as shown in FIG. 6, the tubes of each of the two enclosures are put into exact alignment and brought face-to-face. It is clear that the tubes must have exactly the same dimensions and the same geometrical shapes. In addition, the faces ABCD and A'B'C'D' must be parallel.

The distance a between these faces needs to be accurately established: the method is fully effective only for $a < a_O$ (where $a_O$ is the maximum value for said distance a).

The distance a determines the area through which all of the gas leaving both chambers can flow, and thus adjusts the flow rates of said gases.

Experience shows that this speed must be greater than speed $V_O$, and the corresponding value of $a_O$ is easily calculated. Let Q be the *total* flow rate of all of the gases leaving both chambers and both tubes, and let p be the perimeter of one of the tubes, then, using correspondings units: $a_O = Q/pV_O$.

Figure 7:
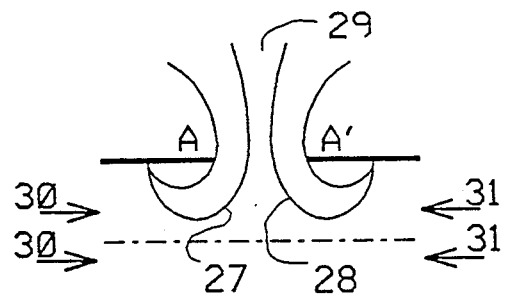
FIG. 7 is a section view showing how the sheets of air flow are deformed during docking.
Figure 8:
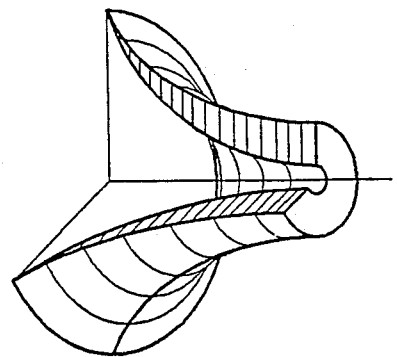
FIG. 8 is a partially cut-away perspective view of the single sheet which comes out from a continuous slot when using a circular tube.

By bringing the tubes of the two enclosures closer together, the gas jets are deformed as shown in FIG. 7.

The space between AB and A'B' is totally filled by cooperation between three sheets of gas flow:

the sheet 27 coming from the top slot of the lefthand enclosure;

the sheet 28 coming from the top slot of the righthand enclosure; and a sheet 29 constituted by the left and right flows due to the excess pressure within each of the two enclosures (i.e. the flow marked by arrow 7).

The sheets 27 and 28 are curved back by the sheet 29 and are therefore not tangential and leave a gap between each other for passing the sheet 29.

Entirely similar reasoning applies to the zone CD'C'D'.

As for the zone AA'D'D it is closed by a "wall" constituted by the side faces of the flows 27, 28, and 29.

The same applies to BB'C'C.

It can thus be seen that the four free faces (such as ABB'A') are fully protected and no gas or dust particle can enter through the various flows of gas running out from a tube, and less still from the flow running out from either enclosure.

When docking takes place, it is possible to reduce the gas flows from one or both enclosures in order to reduce the outlet speed in the gap between the enclosures. In particular, when both enclosures are placed in an atmosphere having relatively low convection movements, there is no advantage in providing a high outlet speed.

The same reasoning applies in both directions, i.e. higher flow rates are needed when connection movements are increased. Taking one enclosure in isolation and while it is stationary, the combined flow rates give an outlet speed $V_s$. If the enclosure is itself displaced at a speed v, then the flow rates need to be increased in order to increase $V_s$ and compensate v.

Since v is generally much smaller $V_s$, it suffices merely to increase $V_s$ by the value of v.

It may be observed that the gas flow sections shown in FIG. 7 as deformed by docking are equally applicable to a rectangular section tube and to a circular section tube.

EXAMPLE

An enclosure is terminated by a rectangular tube having an inside section of 172 mm x 200 mm.

The flow rate along the tube (arrow 7) is 30 cubic meters per hour ($m^3/h$). Each slot is 200 mm long and 0.8 mm wide, and is machined through a part 23 which is 3 mm thick.

The angle 26 between the normal and the axis of the slot is 30°. The flow of filtered air into inlet 9 is adjusted to 3.5 $m^3/h$ for each slot.

The plates of porous material are made of sintered metal having a transparency of 0.2 (i.e. on a section perpendicular to the flow direction, the ratio of pore area/total area is equal to 0.2). Each plate 12 is 200 mm x 30 mm and 1 mm thick.

Each plate 13 is 200 mm x 5 mm and 5 mm thick.

The parts 12 and 13 are machined in a single part. 1 $m^3/h$ of filtered air is applied to each chamber 10 via its inlet 11.

Two enclosures terminated by identical rectangular tubes having inside dimensions of 172 mm x 200 mm are docked to each other at a distance a of less than 100 mm, thereby ensuring that the gas outlet speed is greater than 0.3 m/s.

The example relates only to a rectangular tube, but the description makes it possible to understand that the method is equally applicable both to a rectangular tube and to a circular tube. Naturally, if the tube is circular, a small amount of elliptical deformation may be tolerated as can a small amount of dishing in the faces of a tube which is rectangular in section.

It is also advantageous to observe that the nature and the qualities of the various gases used in the method may be different.

The enclosure is pressurized using a gas $G_1$ which enters the tube along arrows 7. The slots are fed with a gas $G_2$ via inlets 9. The flow rate through the porous medium (12–13) is provided by a gas $G_3$ which is applied to the chambers 10 via inlets 11.

The nature and the cleanness of the gas $G_1$ are determined by the treatment taking place in the enclosure and therefore do not relate to the method of the present invention.

As for the gases $G_2$ and $G_3$, it is normally possible to use filtered air for each of them. There is no danger of the gas from the slots or the porous medium getting into the enclosure; in particular, the flow 7 protects the enclosure from such a danger. This means that a large portion of the gas flows may be provided by using a gas which is particularly cheap, e.g. filtered atmospheric air.

This possibility is particularly advantageous for a moving transfer enclosure. Since no treatment takes place inside it, it can be entirely fed by means of a fan and filters which move together with the enclosure.

I claim:

1. An apparatus for isolating an enclosure from external pollution, said enclosure being associated with a tube having one end opening out into said enclosure and having its opposite end open, the apparatus comprising:
   at least one slot provided in the inside wall of said tube in the vicinity of its open end, said slot being disposed in a plane perpendicular to the axis of said tube and sloping towards said opening, means for feeding said slot with gas so as to blow a continuous sheet of said gas into said tube;
   at least one porous plate disposed on the inside wall of said tube between said slot and said open end, and said plate being fed with a gas which forms a small flow of gas suitable for overcoming the pressure reduction formed by the sheet of gas leaving from said slot; and
   means for maintaining said enclosure at a pressure which is slightly higher than its surroundings so as to create a flow of gas running along said tube and deflecting the sheet(s) of gas leaving said slot towards said open end.

2. An apparatus according to claim 1, wherein the tube is rectangular in section and each of two opposite faces of said tube has a slot disposed therein and fed from a chamber, each of said slots occupying the entire inside width of the tube.

3. An apparatus according to claim 2, wherein the slots are disposed on the two bigger faces of the rectangular tube.

4. An apparatus according to claim 1, wherein:
   the tube is circular in section,
   the slot is continuous and goes all the way around the inside of the tube,
   a chamber feeding the slot with gas surrounds the outside of the tube,
   the porous plate goes around the inside of the tube,
   the porous plate forms a continuous margin around the opening, and
   a chamber goes all around the tube and feeds the porous plates with gas.

5. An apparatus according to claim 1, wherein the speed of the gases leaving the slot is at least ten times the speed of the gases leaving the porous plates.

6. An apparatus according to claim 1, further comprising a second enclosure having a tube substantially identical to the tube of the other enclosure, wherein the docking distance between the two enclosures when the two open ends thereof are juxtaposed is adjusted in such a manner that the outlet speed of all of the gases leaving the two enclosures lies between 0.3 m/s and 0.6 m/s for an ambient atmosphere which is calm, and in that the gas flows in the two enclosures are reduced as much as possible if the gas outlet speed requirement is difficult to achieve.

7. An apparatus according to claim 1, wherein the gas outlet speed via the opening is increased when the enclosure is displaced in order to compensate for the speed of displacement.

8. An apparatus according to claim 1, wherein the higher pressure inside the enclosure is established by blowing in a highly pure gas, and wherein the slots and the porous plates are fed with filtered air.

* * * * *